(12) United States Patent
Voelkner

(10) Patent No.: US 6,339,188 B1
(45) Date of Patent: Jan. 15, 2002

(54) SOLAR LIGHT

(75) Inventor: Harold Emil Voelkner, Tsuen Wan (HK)

(73) Assignee: Sol-Lite Manufacturing Co. Ltd. (HK)

( * ) Notice: Subject to any disclaimer, the term of this patent is extended or adjusted under 35 U.S.C. 154(b) by 0 days.

(21) Appl. No.: 09/448,734

(22) Filed: Nov. 24, 1999

(51) Int. Cl.⁷ .............................................. H01L 25/00
(52) U.S. Cl. ........................ 136/251; 52/173.3; 362/183
(58) Field of Search ........................ 136/251; 52/173.3; 362/183

(56) References Cited

U.S. PATENT DOCUMENTS

| 4,442,826 A | * | 4/1984 | Pleasants | .................... 126/400 |
| 5,213,627 A | * | 5/1993 | Marquardt et al. | .......... 136/251 |
| 5,968,287 A | * | 10/1999 | Nath | ........................... 136/251 |

FOREIGN PATENT DOCUMENTS

| AT | 87927/91 | 2/1992 |
| JP | 07014411 | 1/1995 |
| JP | 08287364 | 11/1996 |
| JP | 10040736 | 2/1998 |
| JP | 10060841 | 3/1998 |
| JP | 11175014 | 2/1999 |

* cited by examiner

Primary Examiner—Mark Chapman
(74) Attorney, Agent, or Firm—Jackson Walker L.L.P.

(57) ABSTRACT

A solar light is provided in the form of a brick so that its housing has the same dimensions as a normal paving brick. A top of the housing is transparent to allow sunlight to enter the housing and illumination provided by LED's to pass out of the housing. The solar light housing in effect forms and is positioned in use as a brick in any structure made up otherwise of normal bricks.

5 Claims, 1 Drawing Sheet

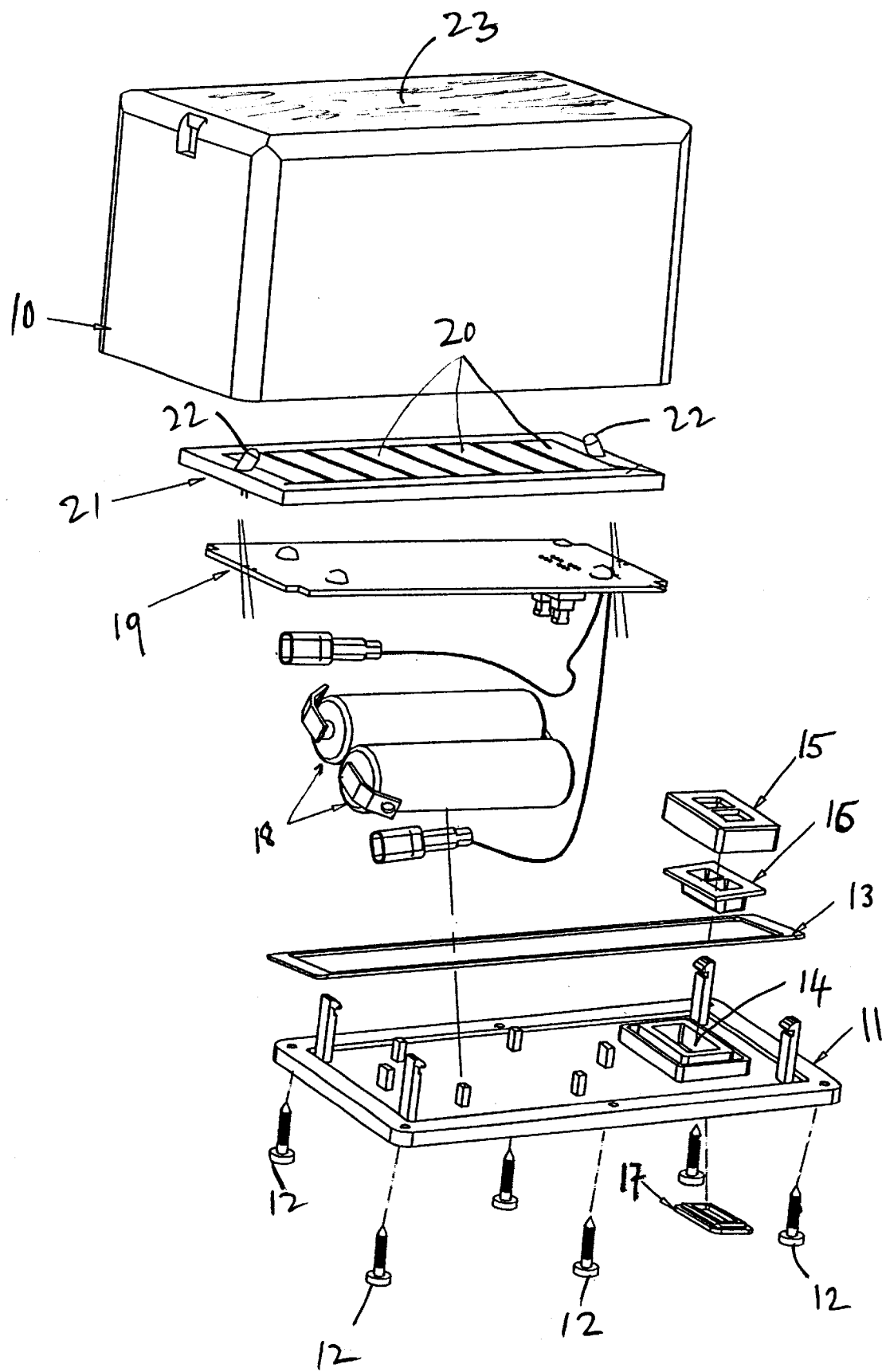

SOLAR LIGHT

BACKGROUND OF THE INVENTION

1. Field of the Invention

The invention relates to solar lights.

2. Description of Prior Art

It is known to provide lighting by using a solar cell to maintain charge in a battery during daytime and to use the battery to power a light for illumination during night time. Such solar lights may operate continually over several months, or more, automatically and without manual supervision or attention. It is known to arrange for the solar light to be sensitive to the level of daylight in its environment to turn ON and OFF automatically and/or be provided with a built-in timer circuit that turns the light ON and OFF for chosen periods of time within each daily cycle. Present day solar lights are usually stand alone items that are positioned or mounted near a drive way or footpath, for example, to provide suitable illumination when required. This means the solar lights must be supported in some way and leads to certain limitations of use.

SUMMARY OF THE INVENTION

It is an object of the invention to overcome or reduce this problem.

According to the invention there is provided a solar cell light comprising a structurally strong housing in the form of a building block component having external dimensions corresponding to other normal modular blocks of a building structure, in which the housing has a side that is transparent to light through which sunlight can pass and out of which light from inside the housing can shine.

The housing is preferably air-tight.

The housing preferably has a removable cover to allow the solar light components to be maintained or changed from time to time.

The removable cover may be at least part of the transparent side.

The housing may have the form of a building brick or a paving slab.

BRIEF DESCRIPTION OF THE DRAWING

A solar light according to the invention will now be described by way of example with reference to the accompanying exploded isometric drawing.

DESCRIPTION OF THE PREFERRED EMBODIMENTS

Referring to the drawing, a structurally strong housing 10 is open at its lower end for closing off by a cover 11. The cover is held to the housing by a number of screws 12 and a gasket 13 provided so that the enclosure within the housing can be made air tight. An aperture 14 in the cover 11 serves as a mounting for an ON-OFF switch 15 and a seal 16 and a cover plate 17 render the aperture region air tight as required. The housing encloses a re-chargeable battery pack 18 and supports a printed circuit board 19 to which circuit components are mounted. Above the circuit board board a number of solar panels 20 are supported in a rectangular frame 21 and an LED 22 is mounted at each end of the frame 21. The top 23 of the housing is transparent, although the top may be frosted or tinted to obscure the inside of the housing 10 from vision.

The top 23 may also be formed in a lens array to focus sunlight more generally on to the solar cells, even when the sun is not vertically above the top 23. Also, a lens array can diffuse light eminating from the LED's 22 to provide a more comfortable or attractive illumination.

The electrical parts of the solar light will not be described as they are generally well-known as such already. Suffice it to explain that the solar cells generate power to charge the battery pack 18 during by converting sunlight into electrical energy. Power from the battery pack is then used to drive the LED's 22 to provide illumination that passes through the top 23.

Except for exceptional maintenance, it is unlikely that the housing 10 will have to be opened, by removing the cover 11, more than once every 2 to 3 years when the battery pack will normally have to be replaced.

It will be appreciated that the removable cover 11 may be transparent and form the top 23 of the housing if preferred.

The switch 16 is provided to turn the solar light ON and OFF before installation. Normally, the switch is managed to choose one of two modes of LED operation, continuously ON or intermittently ON ("blinking"). The circuit may include, as is well-known, a light sensitive switch that automatically turns the LED's off during daylight hours. The circuit may include a programmed timer to turn the LED's 21 ON and OFF during normal use.

The main novelty and utility of the described solar light resides mainly in its physical form and properties. The described solar light can be placed in a drive way, walkway a tiled wall and so forth, to form a source of illumination for the whole or part of each night.

In any event, embodiments of the invention can be made with a housing 10 having the external form of a structural brick, slab or tile, for example. Thus when laying the bricks, slabs or tiles, a solar light of the invention can be inserted instead of a single brick, say, in a structure. The housing 10 has the same mechanical strength as a brick and so can support the weight of a vehicle or person that drives or walks directly over the structure if necessary. No special brackets or mountings are necessary, the solar light is simply cemented or grated into its chosen position in a drive way or walkway as required. It is anticipated that for adequate illumination the described solar lights may take their places amongst normal paving bricks and be about 3 or 4 metres apart in a normal driveway.

I claim:

1. A solar cell light comprising:

a solar cell;

a light bulb electrically connected to the cell; and a structurally strong housing in the form of a brick component having external dimensions corresponding to other normal bricks, in which the housing has a side that is transparent to light through which sunlight can pass and charge said cell and out of which light from the bulb inside the housing can shine.

2. A solar light according to claim 1, in which the housing is air-tight.

3. A solar light according to claim 2, in which the housing has a removable cover to allow the solar light components to be maintained or changed from time to time.

4. A solar light according to claim 3, in which the removable cover is at least part of the transparent side.

5. A solar light according to claim 1, in which the housing has the form of a small paving slab.

\* \* \* \* \*